US010763159B2

(12) United States Patent
Briggs et al.

(10) Patent No.: US 10,763,159 B2
(45) Date of Patent: Sep. 1, 2020

(54) METHOD FOR FORMING A MULTI-LEVEL INTERCONNECT STRUCTURE

(71) Applicant: IMEC VZW, Leuven (BE)

(72) Inventors: Basoene Briggs, Heverlee (BE); Christopher Wilson, Tervuren (BE); Juergen Boemmels, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/518,361

(22) Filed: Jul. 22, 2019

(65) Prior Publication Data
US 2020/0027780 A1    Jan. 23, 2020

(30) Foreign Application Priority Data

Jul. 23, 2018 (EP) ..................... 18184958

(51) Int. Cl.
| | | |
|---|---|---|
| *H01L 21/4763* | (2006.01) | |
| *H01L 21/768* | (2006.01) | |
| *H01L 23/522* | (2006.01) | |

(52) U.S. Cl.
CPC .... *H01L 21/76816* (2013.01); *H01L 21/7681* (2013.01); *H01L 21/76813* (2013.01); *H01L 21/76831* (2013.01); *H01L 21/76879* (2013.01); *H01L 23/5226* (2013.01)

(58) Field of Classification Search
CPC ........... H01L 21/76816; H01L 23/5226; H01L 21/76879; H01L 21/76831; H01L 21/76813; H01L 21/7681; H01L 21/76877; H01L 21/76811; H01L 21/76808
USPC ........................................................ 438/629
See application file for complete search history.

(56) References Cited

U.S. PATENT DOCUMENTS

| | | | |
|---|---|---|---|
| 6,197,682 B1 | 3/2001 | Drynan et al. | |
| 9,236,392 B1 * | 1/2016 | Izumi | ................ H01L 27/11573 |
| 9,286,557 B2 | 3/2016 | Deffeyes et al. | |
| 9,278,462 B2 | 10/2016 | Wang et al. | |
| 9,997,404 B2 | 6/2018 | Wu et al. | |
| 10,020,255 B1 | 7/2018 | Bao et al. | |
| 2016/0064281 A1 | 3/2016 | Izumi et al. | |
| 2016/0118296 A1 | 4/2016 | Kolics et al. | |

* cited by examiner

*Primary Examiner* — Vu A Vu
(74) *Attorney, Agent, or Firm* — Knobbe, Martens, Olson & Bear, LLP (57) ABSTRACT

A method is provided for forming a multi-level interconnect structure on a semiconductor substrate, e.g., for use in an integrated circuit, comprising forming on the substrate a first interconnection level comprising a first dielectric layer and a first set of conductive structures arranged in the first dielectric layer, forming on the first interconnection level a second interconnection level comprising a second dielectric layer and a second set of conductive structures arranged in the second dielectric layer, and forming on the second interconnection level a third interconnection level.

11 Claims, 7 Drawing Sheets

METHOD FOR FORMING A MULTI-LEVEL INTERCONNECT STRUCTURE

INCORPORATION BY REFERENCE TO RELATED APPLICATION

Any and all priority claims identified in the Application Data Sheet, or any correction thereto, are hereby incorporated by reference under 37 CFR 1.57. This application claims priority to European Application No. EP 18184958.9, filed on Jul. 23, 2018. The aforementioned application is incorporated by reference herein in its entirety, and is hereby expressly made a part of this specification.

TECHNICAL FIELD

The methods of the embodiments relate to a method for forming a multi-level interconnect structure on a substrate.

BACKGROUND

There is a continuous strive to make integrated circuits smaller and denser. Integrated circuits typically comprise multi-level interconnect structures. Such a structure may include a number of vertically stacked interconnection levels, each comprising horizontally extending conductive paths or lines arranged in a dielectric layer. Conductive paths of adjacent interconnection levels may be interconnected by vertically extending connections known as vias extending vertically between conductive paths of two interconnection levels.

In conventional circuit fabrication, an interconnection level is typically formed in what in the art is known as a "dual damascene process". According to this approach horizontally extending trenches are etched in a dielectric layer. Further, vertically extending via holes are formed in the dielectric layer. Thereafter the trenches and via holes are simultaneously filled with a conductive material to form conductive lines in the trenches and conductive vias in the via holes. The process may be repeated to form a stack of interconnection levels.

To enable more area efficient and flexible signal routing within an interconnect structure it has been proposed to incorporate so-called multi-level vias or "supervias". A multi-level via is a via which directly interconnects two non-adjacent interconnection levels and electrically bypasses an intermediate level. Although multi-level vias is a promising concept, designing viable integration processes for forming interconnection structures comprising such multi-level vias however remains a challenge.

SUMMARY

An objective of the methods of the embodiments is to provide a method enabling forming of a multi-level interconnection structure comprising a multi-level via in an efficient and reliable manner. Further and/or alternatives objectives may be understood from the following.

According to an aspect of the present methods of the embodiments there is provided a method for forming a multi-level interconnect structure on a substrate, the method comprising: forming on the substrate a first interconnection level comprising a first dielectric layer and a first set of conductive structures arranged in the first dielectric layer, forming on the first interconnection level a second interconnection level comprising a second dielectric layer and a second set of conductive structures arranged in the second dielectric layer, forming on the second interconnection level a third interconnection level, wherein forming the third interconnection level comprises: forming a third dielectric layer, forming a trench mask on the third dielectric layer, the trench mask comprising a pattern of trenches for defining positions of a third set of conductive structures to be formed in the third dielectric layer, forming a multi-level via hole by etching the third dielectric layer in a region exposed within one of said trenches, said multi-level via hole extending through the third dielectric layer and the second dielectric layer to a structure of the first set of conductive structures such that a surface of said structure is exposed at a bottom of the multi-level via hole, selectively depositing a first conductive material in the multi-level via hole on said structure of the first set of conductive structures, transferring the pattern of the trench mask into the third dielectric layer by etching to form a set of dielectric layer trenches for accommodating the third set of conductive structures, and depositing a second conductive material filling said set of dielectric layer trenches, wherein the second conductive material deposited in one of the dielectric layer trenches is deposited on said first conductive material selectively deposited in the multi-level via hole. Said one dielectric layer trench may in the following be referred to as the first dielectric layer trench.

By a method of the embodiments a multi-level interconnection structure with a multi-level via may be formed. More specifically, a structure (such as a conductive path or line) of the third set of conductive structures may be connected to said structure (such as a conductive path or line or a contact) of the first set of conductive structures through a multi-level via formed by conductive material deposited in the multi-level via hole.

Since the multi-level via hole is formed by etching the third dielectric layer through a mask trench (i.e. a trench in the trench mask), the multi-level via hole (and consequently the multi-level via) may be self-aligned with respect to the first dielectric layer trench (and consequently the third set of conductive structures). To facilitate the self-alignment the etching for forming the multi-via hole may be tuned to etch the dielectric material of the second and third dielectric layers selectively to the mask material of the trench mask. In this context, an etch for etching a material "A" selectively to a material "B" means that material A may be etched at a substantially greater rate than material B, in said etch. Hence, a feature of material A arranged adjacent to a feature of material B may be removed in said etch without appreciably affecting the feature of material B. For the multi-level via hole, a ratio of the dielectric material etch rate and the mask material etch rate may advantageously be 30:1 or greater.

According to the method, the forming of the multi-level via hole may be integrated with the forming of the third interconnection level, and hence be formed subsequent to the formation of the second interconnection level. This allows forming of a multi-level via as a vertical interconnect with a relatively low resistance, e.g. compared to a multi-level via formed by a number of separately formed and stacked single-level via pieces.

Further, the method allows reliable forming of a multi-level via with a comparably high aspect ratio (i.e. ratio of vertical-to-width dimension). The selective deposition of the first conductive material in the via hole may provide a bottom-up filling of the multi-level via hole. Thus, uniform filling of the multi-level via hole is possible even if forming the multi-level via hole with a high aspect ratio. In contrast, a top-down fill of a high aspect ratio via hole may result in an irregular via structure and voids within the via hole.

Further, selectively depositing the first conductive material in the multi-level via hole may obviate the need to planarize the structure following deposition since deposition of the first conductive material outside the multi-level via hole may be avoided.

The first conductive material may be selectively deposited on a bottom surface of the multi-via hole. The bottom surface may be formed by the upper surface of the conductive structure of the first set of conductive structures. However, as will be further described below, the deposition of the first conductive material may be preceded with forming of a seed layer on the upper surface of the conductive structure wherein the bottom surface of the multi-via hole, on which the first conductive material is selectively deposited, may be formed by the seed layer. Accordingly, the first conductive material may be selectively deposited on a bottom surface of the multi-via hole, wherein the bottom surface is formed either by the upper surface of the conductive structure of the first set of conductive structures or by a seed layer formed on the upper surface of the conductive structure of the first set of conductive structures.

The conductive structures of the first interconnection level may be formed of a metal (e.g. a single metal or a combination of two or more different metals). The first conductive material (and if present the seed material) may be formed of a (respective) metal (e.g. a single metal or a combination of two or more different metals). Hence, metal-on-metal selective deposition of the seed layer material and/or the first conductive material may be employed. Deposition of the seed and/or first conductive material on exposed non-metal surfaces may thus be avoided.

Although the methods of the embodiments may be put to advantageous use in any situation where a multi-level via is desired, the methods of the embodiments may be particularly advantageous in advanced technology nodes with conductive line pitches below 40 nm, for instance N7, N5 and smaller nodes. In such applications space for routing may become limited due to congestion in the first metal layers. This congestion may in particular be due to presence of conductive "islands" (i.e. minimum length lines) in an intermediate second interconnection level which are provided to serve as landing pads between pairs of lower and upper conventional single-level vias. The multi-level via reduces the need for such "islands" and thereby enables a more are efficient circuitry.

By "interconnection level" is hereby meant a level, or a tier, of an interconnect structure. An interconnection level may also be referred to as a metallization or a routing level. The first through third interconnection levels may form consecutive levels of the interconnect structure. I.e. the second interconnection level may be formed directly on the first interconnection level and the third interconnection level may be formed directly on the second interconnection level. It should further be noted that the first interconnection level need not necessarily be a lower most interconnection level of the interconnect structure but one or more further interconnection levels may be present below the first interconnection level.

Each interconnection level includes a set of conductive structures. A set of conductive structures may comprise a set of horizontal conductive paths or lines arranged in a common horizontal plane. The set of conductive lines of each interconnection level may be arranged to provide a horizontal routing of (electrical) signals, i.e. a routing within the common horizontal plane. As used herein, the term "horizontal" in relation to a plane or a direction denotes a direction or plane being parallel to a main plane of extension of any of the interconnection levels. The multi-layer interconnect structure may be supported by a substrate wherein the term "horizontal" direction or "horizontal" plane equivalently may be understood as a direction parallel to a main plane of extension or a main surface of the substrate. The set of conductive structures may comprise a set of vertical conductive vias. The set of vertical conductive vias may be arranged to provide vertical routing of signals, i.e. routing between different interconnection levels. As used herein, the term "vertical" in relation to a direction or plane denotes a direction or plane being perpendicular to a horizontal direction or horizontal plane. I.e. the term "vertical" direction or "vertical plane" denotes a direction or plane being perpendicular to a main plane of extension of any of the interconnection levels, or to (a main surface of) a substrate supporting the interconnect structure.

By a first feature such as a layer, a level or other structure, being formed "on" a second feature such as a layer, a level or other structure, is hereby meant that the first feature may be formed directly on the second feature, i.e. in abutment with the second feature, or with one or more layers or structures intermediate the first and the second feature, i.e. not in direct contact with the second feature, unless explicitly stated otherwise.

The first conductive material may be selectively deposited to only partially fill the multi-level via hole. Thereby a lower portion of the multi-level via hole may be reliably filled by the selective deposition. A remaining un-filled upper portion of the multi-level via may thereafter be filled by the deposited second conductive material. The dielectric layer trenches may however also be formed with a depth in the third dielectric layer such that an upper surface of the first conductive material deposited in the multi-level via hole is exposed in the first dielectric layer trench. I.e. the first dielectric layer trench may be formed with a depth in the third dielectric layer such that a bottom surface of the first dielectric layer trench is formed flush with or at a level below the upper surface of the first conductive material deposited in the multi-level via hole. Thus, a remaining un-filled upper portion of the multi-level via may, in a sense, be "removed" during the trench formation.

According to one embodiment the method further comprises forming a via mask above the trench mask, the via mask including an opening exposing said region of the third dielectric layer, wherein the multi-level via hole is formed by transferring said opening into the third and second dielectric layers by etching. The dimensions of the via can thus be easily controlled by defining the opening in the via mask. Since the via mask is formed above the trench mask it is possible make oversize the opening in the via mask (for instance with a width greater than a width of the trench in the trench mask). This may facilitate the "printing" of the opening in the via mask. Since the via mask is formed above the trench mask some margin against mask overlay errors is also enabled, especially if the multi-level via hole etch is a selective etch, as discussed above.

According to one embodiment the method further comprises forming a dielectric liner covering a sidewall of the multi-level via hole and exposing said surface of said structure of the first set of conductive structures. The dielectric liner reduces the risk of short circuits between the multi-level via and neighboring conductive structures, may be reduced. For instance, risk of shorting to the conductive structures of the second interconnection level which the multi-level via extends through may be mitigated. Further, fringe capacitance between the multi-level via and neighboring conductive structures may be reduced. Further, the dielectric liner may further counteract diffusion of the first conductive material from the multi-level via into the surrounding dielectric.

Further, the dielectric liner may be formed also on the sidewalls of the trenches of the trench mask. Covering the sidewalls of the trench mask may reduce the tendency for the first conductive material to nucleate on these surfaces during the selective deposition of the first conductive material. This may increase the flexibility in terms of choice of material for the trench mask. More specifically, it may improve the feasibility in using a metal-based hard mask material for the trench mask. The trench mask may for instance comprise a lower metal-including mask layer and an upper non-metal mask layer. Hence, both nucleation on metal-including sidewalls of the mask trenches and on an upper surface of the trench mask may be counteracted.

According to one embodiment the method further comprises depositing, in the multi-level via hole, a seed layer on said surface of said structure of the first set of conductive structures and thereafter selectively depositing said first conductive material on the seed layer. By this the subsequent selective deposition of the first conductive material may be facilitated by choosing a seed layer simplifying nucleation of the first conductive material. The seed layer may be deposited on said surface by selectively depositing a seed material on said surface of the conductive structure of the first set of conductive structures.

According to one embodiment filling of the multi-level via hole includes depositing the first conductive material in the multi-level via hole by an electro-less deposition (ELD) process. ELD enables deposition with advantageous selectivity and deposition rate. Alternatively, the first conductive material may be deposited in the multi-level via hole by an atomic layer deposition (ALD) process.

According to one embodiment the method further comprises removing the trench mask prior to said act of filling said set of trenches.

The trench mask may comprise a hard mask material. Effective hard mask materials include TiN for instance or SiN. The trench mask may also comprise a stack of trench mask layers of different materials. The trench mask may for instance comprise an upper non-metal mask layer formed on a lower metal-including mask layer.

According to one embodiment the method further comprises, subsequent to said act of selectively depositing the first conductive material in the multi-level via hole, forming a single-level via hole by etching the third dielectric layer in a region exposed within one of said trenches, said single-level via hole extending partially through the third dielectric layer, wherein during said act of transferring the pattern of the trench mask into the third dielectric layer, a bottom surface of said single-level via hole is etched back such that the single-level via hole extends to and exposes a surface of a structure of said second set of conductive structures. Thereby a "single-level via" may be formed during the step of filling the trenches, since the second conductive material may fill the single-level via hole as well. The single-level via may connect a conductive structure of the third interconnection level with a conductive structure of the second interconnection level.

BRIEF DESCRIPTION OF THE DRAWINGS

The above, as well as additional objects, features and advantages of the methods of the embodiments, will be better understood through the following illustrative and non-limiting detailed description, with reference to the appended drawings. In the drawings like reference numerals will be used for like elements unless stated otherwise.

FIGS. 1A through 1L schematically illustrate a method for forming a multi-level interconnect structure wherein FIGS. 1A and 1L are perspective views of a section of a semiconductor structure and FIGS. 1B-L are side views of the same section of the semiconductor structure.

DETAILED DESCRIPTION

A method for forming a multi-level interconnect structure will now be disclosed with reference to FIGS. 1A through 1L. In the FIGURES the indicated directions X, Y and Z consistently refer to a first horizontal direction, a first vertical direction and a second horizontal direction, respectively. It should be noted that the semiconductor structure 1 may extend laterally or horizontally beyond the illustrated portions. It should further be noted that, owing to the schematic nature of the drawings, the relative dimensions of the various structures and layers are not drawn to scale. Rather the dimensions have been adapted for illustrational clarity and to facilitate understanding of the following description.

Figure 1A:
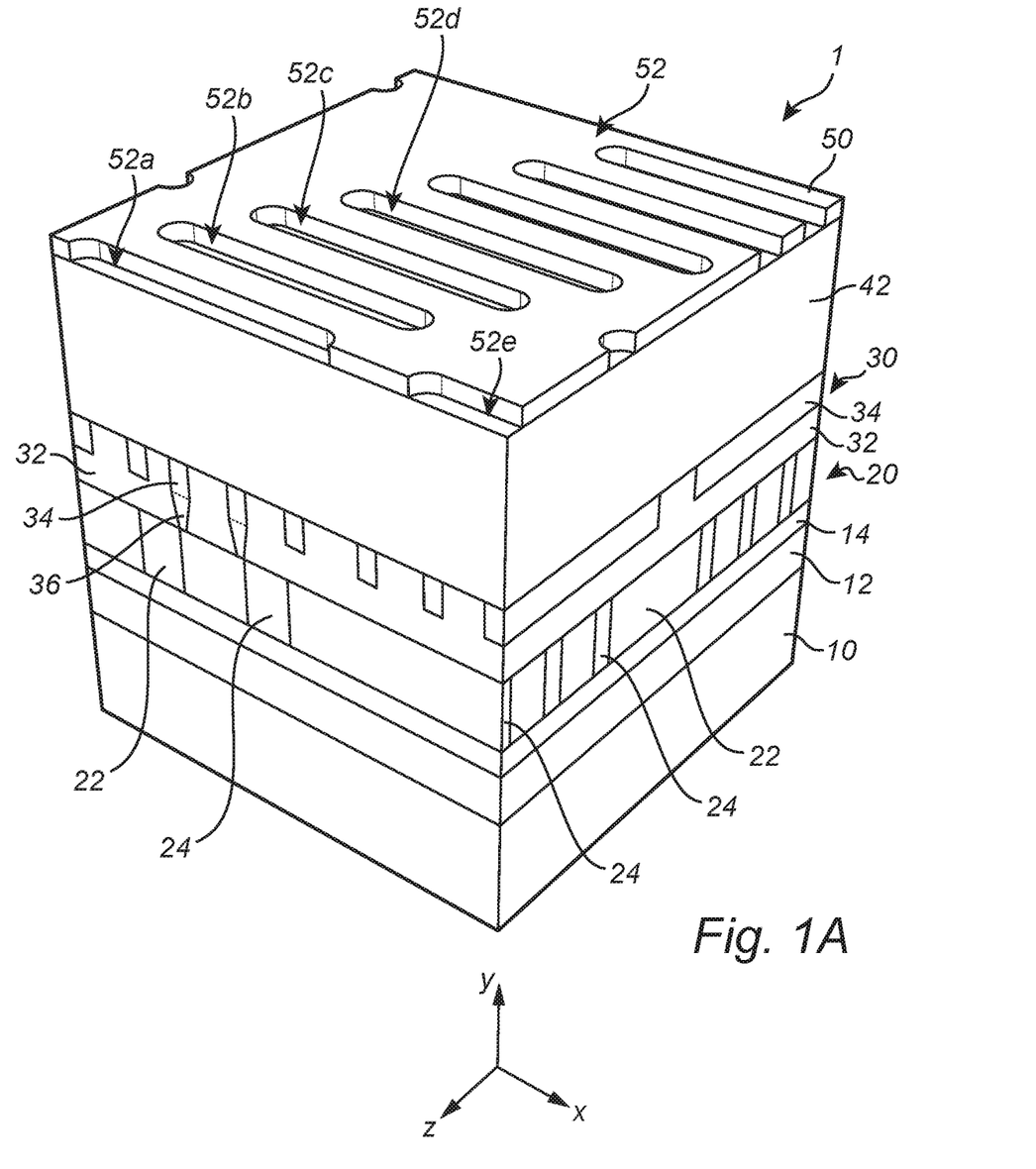

At the stage of the method shown in FIG. 1A, a first interconnection level 20 has been formed on an underlying substrate 10. The substrate 10 may be a semiconductor wafer or substrate, for instance a Si substrate, a Ge substrate, a SiGe substrate, a SiC substrate, a SOI substrate, a GeOI substrate, a SiGeOI substrate to name a few examples. As shown, the substrate 10 may support an active device layer 12. The active device layer 12 may include active devices, for instance semiconductor devices such as transistors and other solid state devices. The active devices may have been formed using conventional front-end-of-line (FEOL) processing. The active device layer 12 may be covered by an interlayer dielectric 14.

The first interconnection level 20 may include a dielectric layer 22 and a first set of conductive structures comprising conductive lines 24 arranged in the dielectric layer 22. The conductive lines 24 may as shown be mutually parallel and extend in parallel to the first horizontal direction X. The dielectric layer 22 may be of a low-k dielectric material such as silicon dioxide. The dielectric layer 22 may also be a stack of two or more different dielectric material layers, such as a lower low-k dielectric layer and upper interface and/or oxide capping layers.

A second interconnection 30 level has been formed on the first interconnection level 20. The second interconnection level 30 may include a dielectric layer 32 and a second set of conductive structures comprising conductive lines 34 arranged in the dielectric layer 32. The conductive lines 34 may extend in a horizontal direction in the dielectric layer 32. The conductive lines 24 may as shown be mutually parallel and extend in parallel to the second horizontal direction Z. The dielectric layer 32 may be of a same composition as the first dielectric layer 22.

The second set of conductive structures of the second interconnection level 30 may further include a number of conductive vias 36 extending in the vertical direction Y through the dielectric layer 32. The vias 36 may electrically connect a conductive line 34 of the second interconnection level 30 with a conductive line 24 of the first interconnection level 20. Although not shown, the first set of conductive structures of the first interconnection level 20 may also include conductive vias extending through the interlayer dielectric 14 to connect to contacts in the active device layer 12.

The first and second interconnection levels may for instance be formed in a dual-damascene process, or some other BEOL-process conventionally used for forming interconnect levels.

The conductive lines and the conductive vias of each interconnection level 20, 30 may be made of a conductive material, preferably a metal material, such as aluminum, cobalt, copper, tungsten or ruthenium, or combinations thereof. The conductive material may be deposited in trenches and via holes formed in the dielectric layer of the respective interconnection level for instance by electroplating, chemical vapor deposition (CVD) or atomic layer deposition (ALD), or physical vapor deposition (PVD).

Although the above described first set of conductive structures of the first interconnection level 20 includes conductive lines and optionally conductive vias, the first set of conductive structures may also be contact structures of active devices forming part of a contact level, i.e. "M0" or middle-end-of-line (MEOL) level. More generally, the first interconnection level may be interconnection level "MX", the second interconnection level may be interconnection level "MX+1", and the third interconnection level to be formed may be interconnection level "MX+2", where X is equal to 0 or greater.

As further shown in FIG. 1A, a third dielectric layer 42 has been formed on the second interconnection level 30. The third dielectric layer 42 may be of a low-k dielectric material such as silicon dioxide. The dielectric layer 42 may be a stack of two or more different dielectric material layers, such as an interface layer and/or an oxide capping layer.

A trench mask 50 has been formed on the third dielectric layer 42. The trench mask 50 has been patterned to include a number of trenches 52a-e exposing the underlying third dielectric layer 42. The trench mask 50 may be patterned to include the trenches 52a-e using single or multi-patterning techniques (e.g. spacer assisted double patterning or spacer assisted quadruple patterning). The trench mask 50 may be a hard mask, for instance of a metal-including hard mask material such as titanium nitride, titanium oxide, hafnium oxide, zirconium oxide, tungsten carbon nitride, or a ruthenium or aluminum alloy. The mask material may be deposited by any suitable deposition method such as ALD, CVD or physical vapor deposition (PVD). The trench mask 50 may also be a layer of a non-metal-based material such as a-C, a-Si, spin-on-carbon (SOC), SiCN, SiN or even a photoresist. A multi-layered trench mask 50 is also possible, such as a metal-including hard mask material layer covered by a non-metal-based material layer.

Figure 1B:
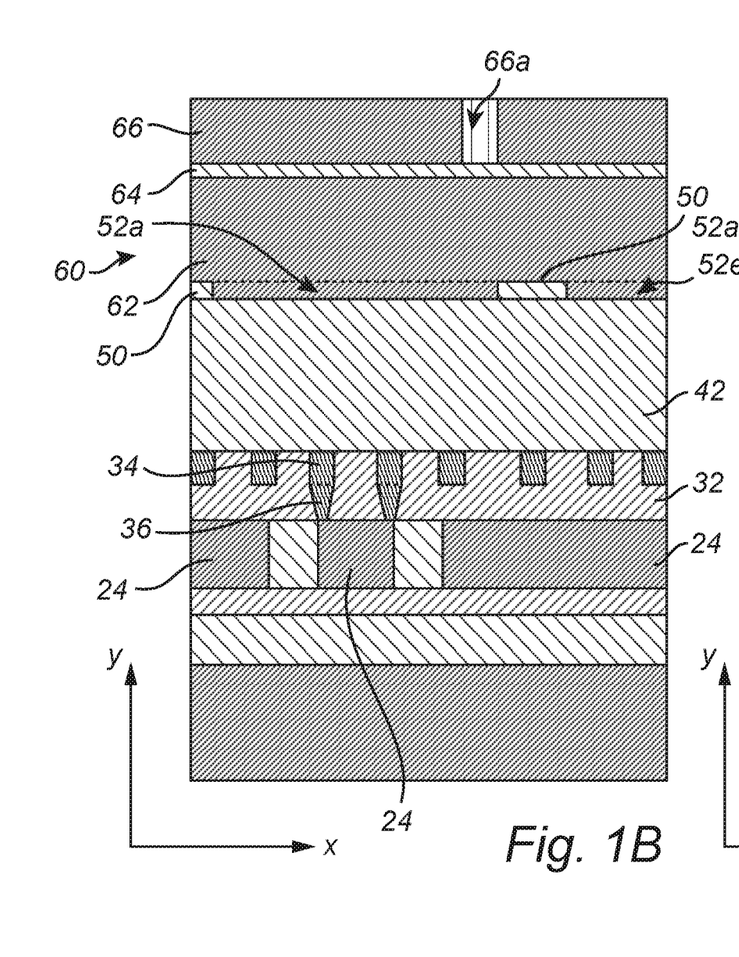

FIG. 1B shows is a plane view along the section plane extending through the front trenches 52a, 52e in FIG. 1A. In FIG. 1B a via mask 60 has been formed on the trench mask 50. The via mask 60 may be a mask layer stack including for instance a spin-on-carbon (SOC) layer 62 and a spin-on-glass (SOG) layer or SiOC-layer 64. In any case, the via mask 60 (or at least the lower material layer thereof) is advantageously formed of a different material than the trench mask 50. This may allow the via mask 60 to later be removed selectively to the trench mask 50, for instance by etching or using a suitable solvent. The via mask 60 is formed on the trench mask 50 such that the trenches 52a-e of the trench mask 50 are filled by the via mask material, or at least a lower material layer thereof (i.e. in the illustrated example the SOC layer 62).

A resist layer 66 has been formed on the via mask 60. An opening 66a has been patterned in the resist layer 66, for instance in a lithographic process. The opening 66a has been formed above a region of the third dielectric layer 42 exposed within the trench 52a, where a multilevel via hole 70 is to be formed (as shown in FIG. 1D). The opening 66a may be formed with a lateral dimension along the second horizontal direction Z such that the horizontal cross sectional area of the opening 66a at least meets or optionally slightly exceeds a horizontal width of the underlying trench 52a of the trench mask 50. Since the trench mask 50 is present below the via mask 60 the trench mask 50 may counteract etching of the third dielectric layer 42 in regions outside of the trench 52a even if the opening 66a is slightly oversized or displaced in relation to the trench 52a.

Although FIG. 1B only shows forming of a single opening 66a, it may be understood that a number of such openings 66a may be formed to enable forming of a corresponding number of multi-level via holes. Each opening 66a may accordingly be formed along a respective one of the trenches 52a-e or even along a same trench of the trench mask 50.

Figure 1C:
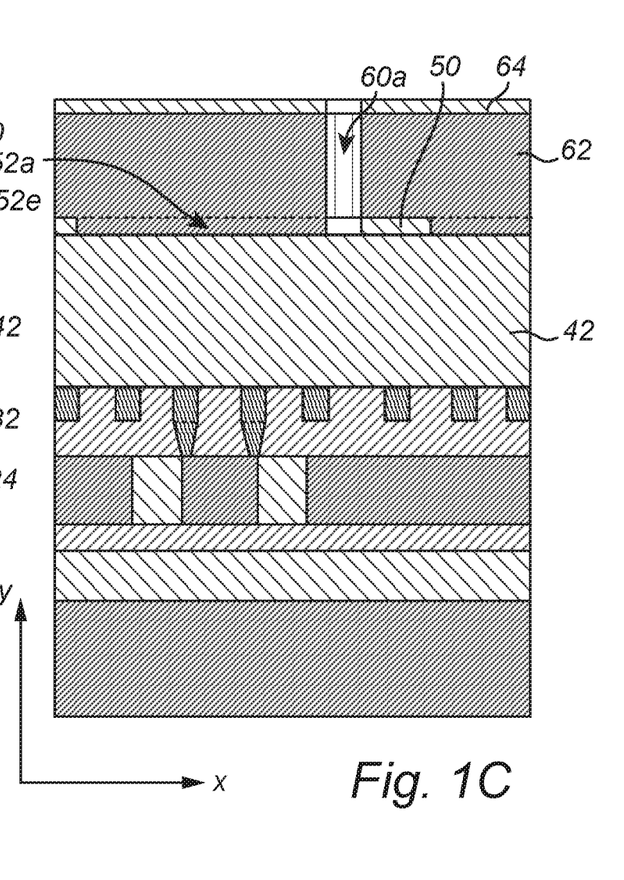
Figures 1D, 1E:
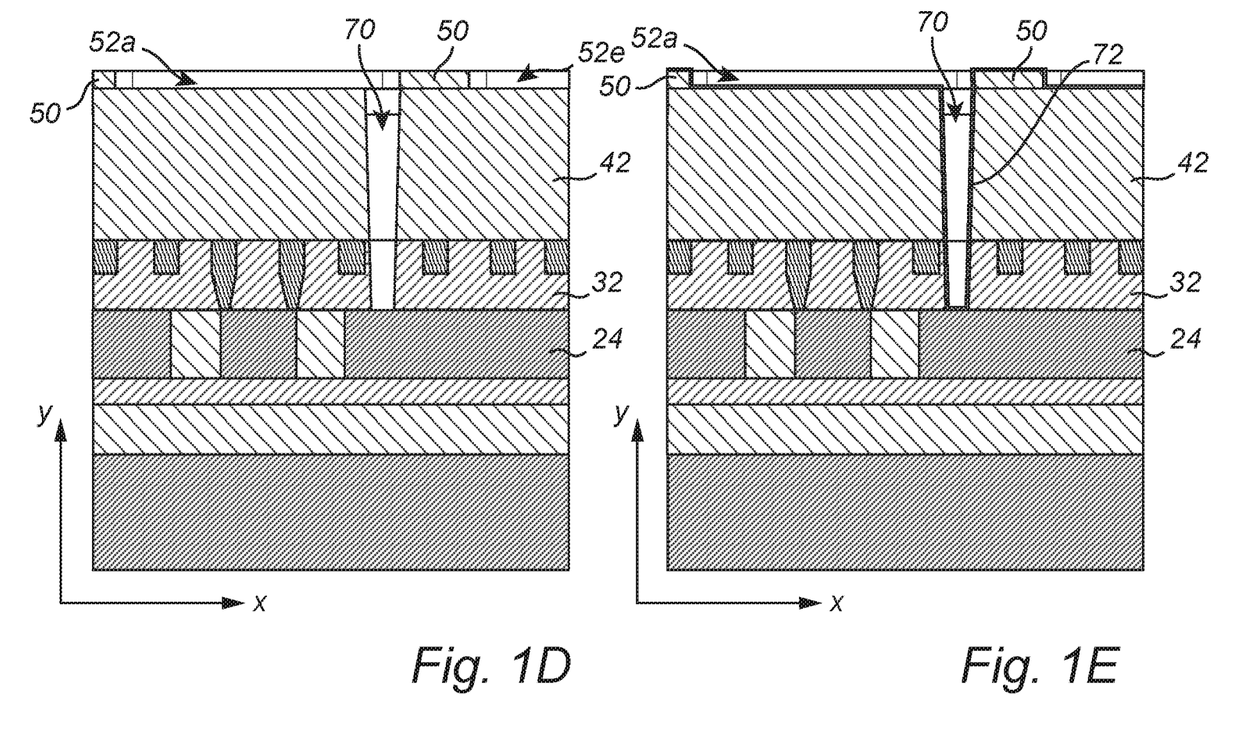

At the stage of the method shown in FIG. 1C the opening 66a has been extended vertically through the via mask 60 to form/print an opening 60a exposing an upper surface portion of the third dielectric layer 42. The opening 60a may be extended through the SOC layer 62 and the SOG layer 64. The opening 60a may be formed by etching the via mask 60 through the opening 66a in a single dry or wet etch step or in a sequence of different dry or wet etch steps.

At the stage of the method shown in FIG. 1D a multi-level via hole 70 has been formed. The multi-level via hole 70 extends vertically through the third dielectric layer 42 and the second interconnection level 30 such that it exposes an upper surface portion of the conductive line 24 of the first interconnection level 20. The multi-level via hole 70 may be formed by transferring the opening 60a in the via mask 60 into the third and second dielectric layers 42, 32 by etching using the via mask 60 as an etch mask. A conventional etch compatible with the via mask 60 as well as the trench mask 50 and being suitable for etching of high-aspect ratio holes may be used, for instance a dry etch such as a reactive ion etch (RIE), an ion beam etch (IBE), or an atomic layer etch (ALE). The via mask 60 may be removed subsequent to the formation of the multi-level via hole 70, selectively to the trench mask 50.

In FIG. 1E a dielectric liner 72 has been formed on the sidewalls and bottom surface of the multi-level via hole 70. The liner 72 may as shown also be formed upper horizontal surfaces and sidewalls of the structure. The liner 72 may cover the sidewalls and bottom of the trenches 52 of the trench mask 50. The dielectric liner 72 may be formed by SiOx, SiN, SiCN or SiCO. Other examples include non-conductive metal oxides such as AlOx and AlN. The liner may be deposited as a conformal layer, for instance by atomic layer deposition (ALD). A thickness of the liner may typically depend on the width of the multi-level via hole which in turn may depend on the technology node. As one example, a thickness of 3 nm or below may be appropriate to provide a function of a metal diffusion barrier, sufficient isolation and provide a margin against offset overlay errors during printing of the opening 60a in the via mask 60.

Figure 1F:
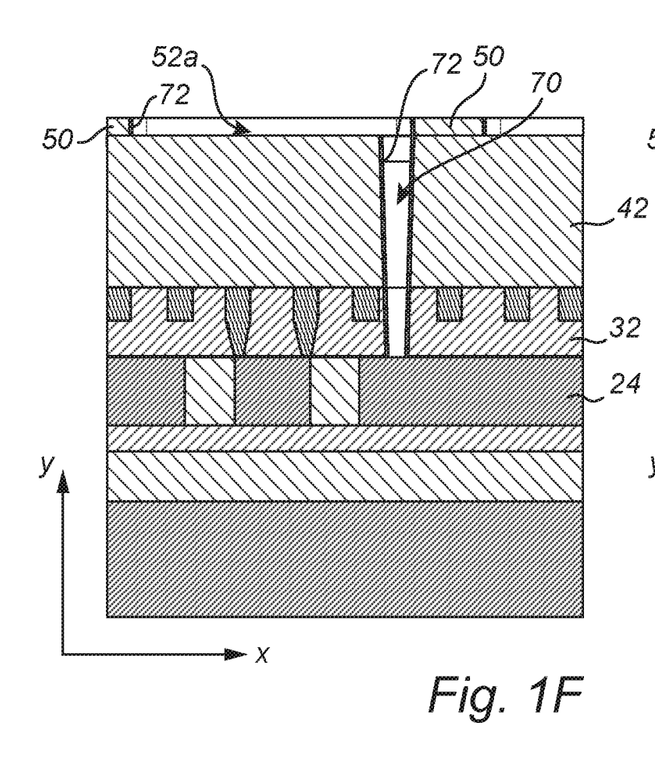

At the stage of the method shown in FIG. 1F the dielectric liner 72 has been subjected to an anisotropic vertical etch to remove dielectric liner layer portions deposited on horizontally oriented surfaces, including the bottom of the multi-level via hole 70, the bottom of the trenches 52 and the upper surface of the trench mask 50. The liner 72 still remains on the sidewalls of the multi-level via hole 70. The liner 72 may also still remain on the sidewalls of the trenches 52.

As an alternative to a non-selective conformal deposition followed by a vertical etch, the dielectric liner 72 may be formed by selective dielectric-on-dielectric deposition (DoD). The dielectric liner material may thereby be selectively deposited on the dielectric sidewalls formed by the material of the third and second dielectric layers 42, 32 within the multi-level via hole 70. The dielectric liner may also form on the upper surface regions of the third dielectric layer 42 exposed within the trenches of the trench mask 50. This obviates the need for an anisotropic vertical etch step to expose the upper surface of the conductive line 24 within the multi-level via hole 70.

Figure 1G:
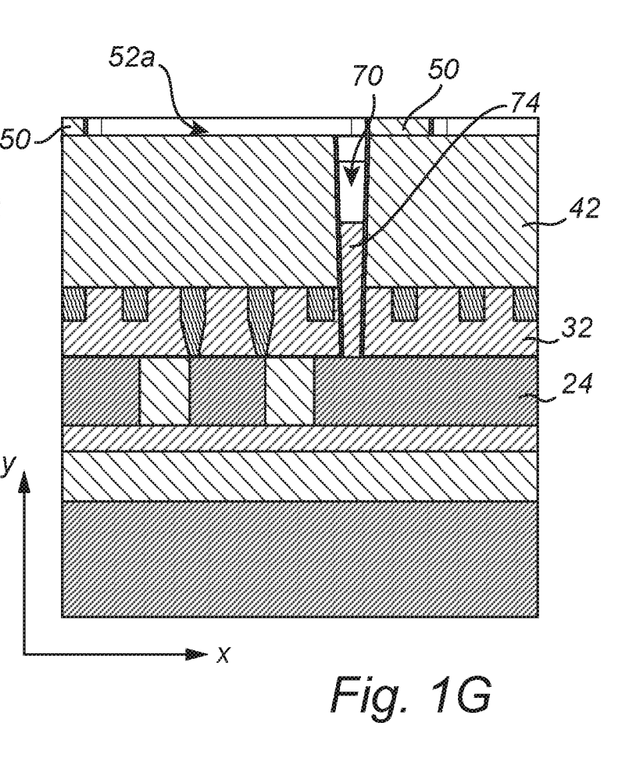

At the stage of the method shown in FIG. 1G the multi-level via hole 70 has been filled by a (first) conductive via material 74. The conductive material 74 may be selectively deposited in the multi-level via hole 70, on the surface portion of the conductive line 24 exposed at the bottom of the multi-level via hole 70. The conductive material 74 may hence be deposited selectively in the multi-level via hole 70 in a bottom-up fashion. Substantially no conductive material 74 need hence be deposited outside the multi-level via hole 70. The conductive metal may be deposited by electro-less deposition (ELD). The conductive material 74 may be a metal such as ruthenium, copper, tungsten or cobalt. Area-selective ALD is however also possible. More generally, any deposition process (e.g. vapor-phase CVD, PVD, or plasma-enhanced CVD) allowing selective metal-on-metal deposition may be employed. The deposition technique may be chosen in consideration of the availability of precursors for the intended fill material, the deposition rate, the selectivity ratio, and cost.

Prior to the deposition of the conductive material 74 a seed layer may be deposited on the bottom surface of the multi-level via hole 70, which is formed by the upper surface portion of the conductive line 24. The conductive material 74 may then be selectively grown on the seed layer. The seed layer may be formed by selectively depositing a conductive seed material in the multi-level via hole 70 by an atomic layer deposition (ALD) process. For instance, a ruthenium seed layer may be used to facilitate a subsequent selective deposition of ruthenium, a cobalt or palladium seed layer may be used to facilitate a subsequent selective deposition of cobalt, a copper or ruthenium seed layer may be used to facilitate a subsequent selective deposition of copper. It is however also possible to use a non-metal seed layer such as a seed layer of a self-assembled monolayer (SAM) chosen to facilitate nucleation of the subsequently deposited first conductive material. SAMs allowing selective area deposition of metals are per se known in the art and will therefore not be further elaborated on herein.

The extent to which the multi-level via hole 70 is filled by selective deposition is a design option and either a mere partial filling of the multi-level via hole 70 or a complete filling, or even over-filling, of the multi-level via hole 70 is possible. The multi-level via hole 70 may be filled at least to a level such that a remaining un-filled portion of the multi-level via hole 70 may be filled using a top-down deposition process, such as electro-plating, CVD or ALD.

Figure 1H:
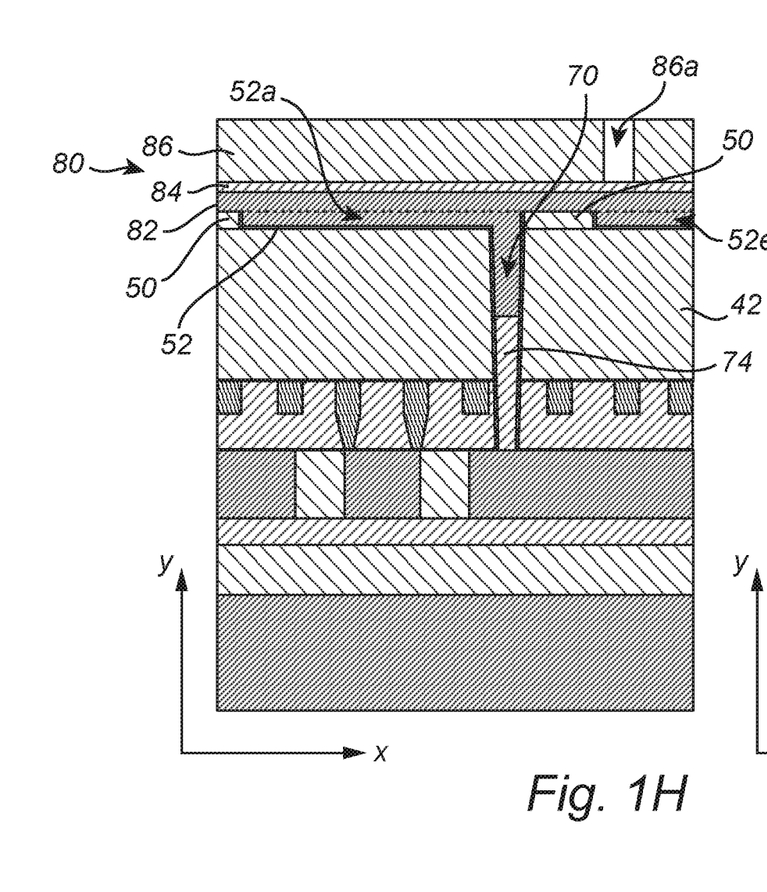

At the stage of the method shown in FIG. 1H a further (second) via mask 80 has been formed on the trench mask 50. The via mask 80 may be of a similar structure and composition as the above-discussed (first) via mask 60 and accordingly comprise a SOC layer 82 and a SOG layer 84. The via mask 80 is formed on the trench mask 50 such that the trenches 52 of the trench mask 50 are filled by the via mask material, or at least a lower material layer thereof (i.e. in the illustrated example the SOC layer 82).

A resist layer 86 has been formed on the via mask 80. An opening 86a has been patterned in the resist layer 86, for instance in a lithographic process. The opening 86a has been formed above a region of the third dielectric layer 42 exposed within the trench 52e, where a via hole 71a is to be formed (as shown in FIG. 1J). The discussion of the lateral dimension of the opening 66a in the resist layer 66 applies correspondingly to the lateral dimension of the opening 86a with respect to the horizontal width of the underlying trench 52e of the trench mask 50.

Although FIG. 1H only shows forming of a single opening 86a, it may be understood that a number of such openings 86a may be formed to enable forming of a corresponding number of single-level via holes. Each opening 86a may accordingly be formed along a respective one of the trenches 52, 52a, 52b, 52c, or even along a same trench of the trench mask 50.

Figure 1I:
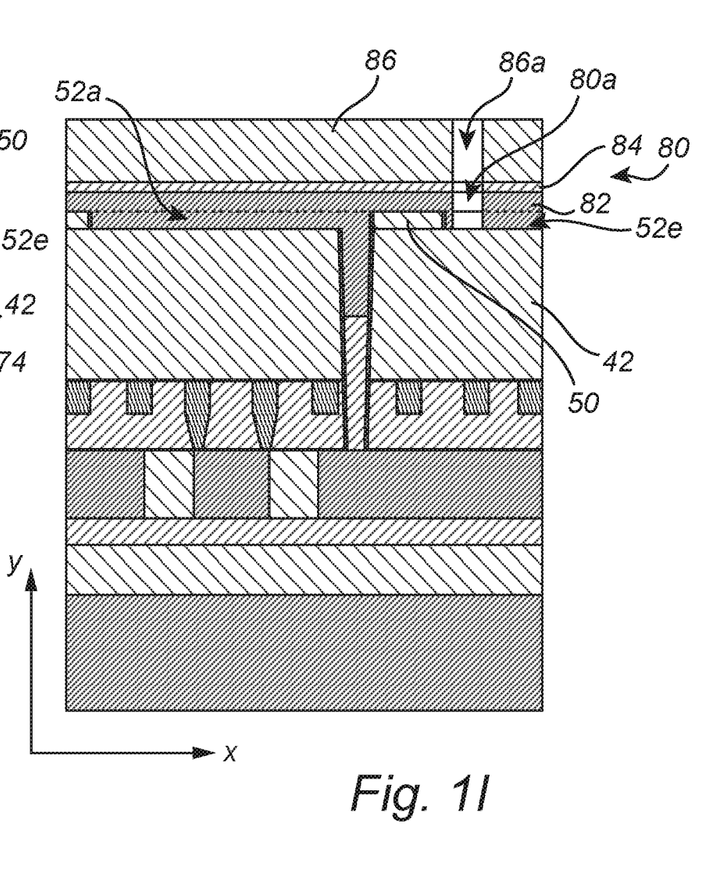
Figure 1J:
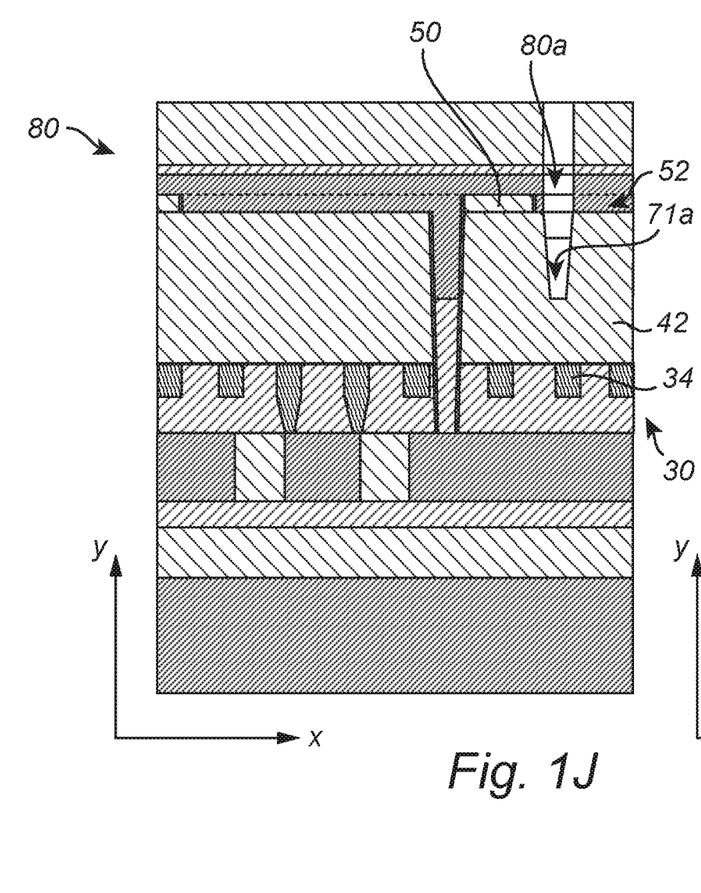

At the stage of the method shown in FIG. 1I the opening 86a has been extended vertically through the via mask 80 to form an opening 80a exposing an upper surface portion of the third dielectric layer 42. The hole 80a may be extended through the SOC layer 82 and the SOG layer 84. The opening 80a may be formed by etching the via mask 80 through the opening 86a in a single dry or wet etch step or in a sequence of different dry or wet etch steps.

At the stage of the method shown in FIG. 1J a preliminary single-level via hole 71a has been formed. The preliminary via hole 71a may be formed by transferring the opening 80a in the via mask 80 into the third dielectric layer 42 by etching using the via mask 80 as an etch mask. A conventional etch process may be used, such as a RIE-, IBE-, or ALE-process. The single-level via hole 71a extends only partially through the third dielectric layer 42. Thus, a bottom surface of the preliminary via hole 71a is formed by a thickness portion of the dielectric layer 42 remaining on an underlying conductive line 34 of the second interconnection level 30. The height of the thickness portion may correspond, at least roughly, to an intended depth of trenches which are to be formed in the third dielectric layer 42 for accommodating a set of conductive lines of a third interconnection level. The via mask 80 may be removed subsequent to the formation of the preliminary via hole 71a.

Figure 1K:
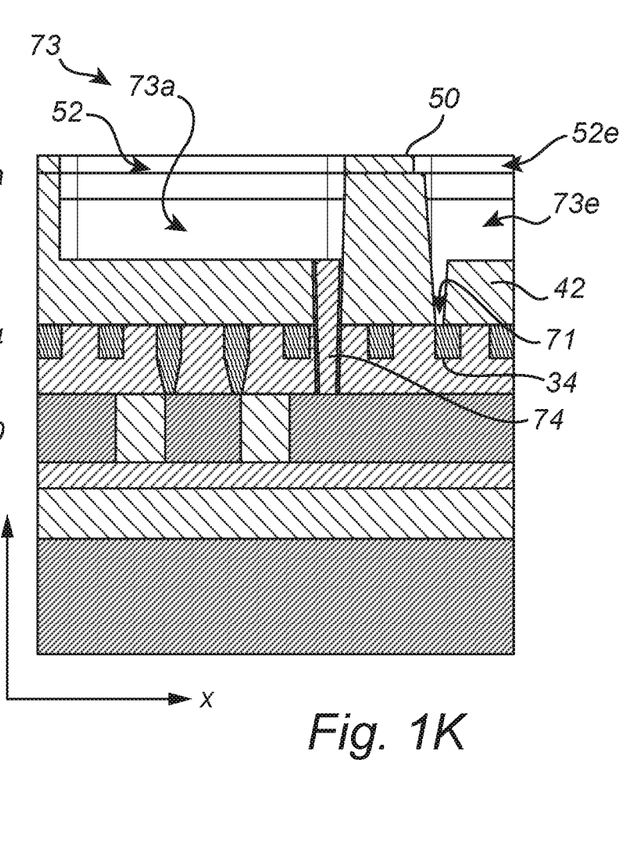

In FIG. 1K the trenches 52 of the trench mask 50 have been transferred into the third dielectric layer 42 such that dielectric layer trenches 73 comprising trenches 73a and 73e have been formed. As shown in FIG. 1K, the dielectric layer trenches 73 may be formed with a vertical depth in the third dielectric layer 42 such that an upper surface of the conductive material 74 in the via hole 70 is exposed in the dielectric layer trench 73a. However, depending on the extent to which the multi-level via hole 70 was filled with the conductive material 74, the dielectric layer trenches 73 may be formed with a depth such that the bottom surface of the dielectric layer trenches 73 is at a level above or below a top portion of the conductive material 72 deposited in the multi-level via hole 70. The trenches 52 may be transferred into the dielectric layer 42 by etching while using the trench mask 50 as an etch mask. A conventional dielectric etch process may be used, such as a RIE-, IBE- or ALE-process. The etch may additionally etch back the bottom surface of the preliminary via hole 71a such that a final single-level via hole 71 is formed which extends from a bottom of the trench exposes a region of an underlying conductive line 34 of the second interconnect level 50.

Figure 1L:
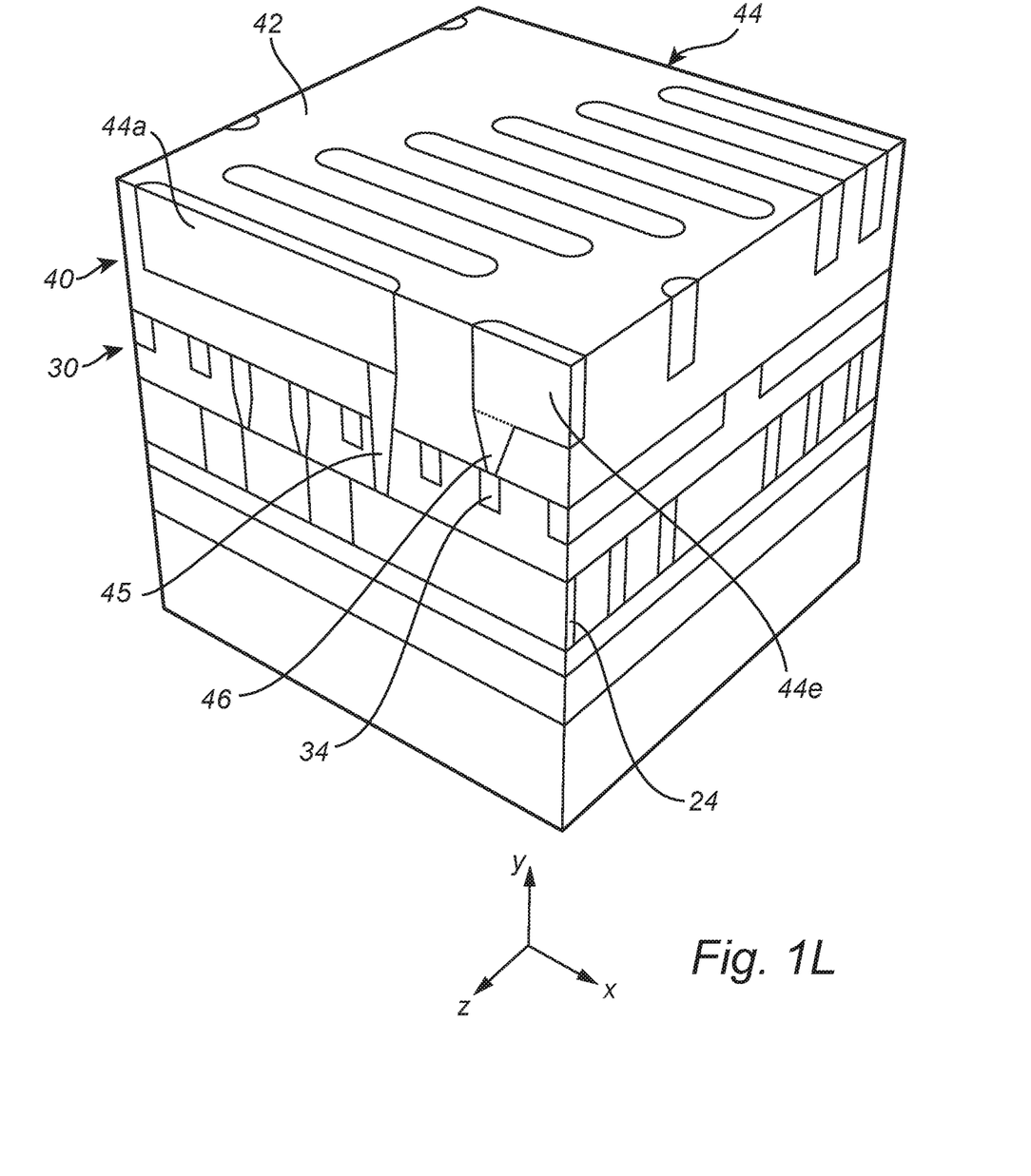

At the stage of the method shown in FIG. 1L the trench mask 50 has been removed and the dielectric layer trenches 73, including the trenches 73a and 73e, have been filled with a (second) conductive material, i.e. a conductive line material. Conductive lines 44 have thereby been formed in the dielectric layer trenches 73 of the third dielectric layer 42. The conductive line material deposited in the dielectric layer trench 73a forms a conductive line 44a which is connected to the line 24 of the first interconnection level 30 by a multi-level via 45. Depending on the extent to which the multi-level via hole 70 was filled by the conductive material 74, the multi-level via 45 may either be formed only by the previously deposited conductive material 74, or by the previously deposited conductive material 74 together with a portion of the conductive line material deposited in an upper un-filled portion of the multi-level via hole 70.

The conductive line material deposited in the dielectric layer trench 73e forms a conductive line 44e which is connected to the conductive line 34 of the second interconnection level 30 by a single-level via 46. The single-level via 46 may be formed by a portion of the conductive line material deposited in the single-level via hole 71. Thus a third interconnection level 40 has been formed comprising a third set of conductive structures comprising conductive lines 44 and number of single-level vias 46. The third interconnection level 40 comprises a conductive line 44a which is directly connected to the line 24 of the first interconnection level 20 by the multi-level via 45. The third interconnection level 40 comprises a conductive line 44e which is directly connected to the line 34 of the second interconnection level 30 by the single-level via 46. The conductive line material may comprise one or more conductive materials, including one or more metals such as aluminum, copper or tungsten. The deposition of the conductive line material may be preceded by deposition of a conventional liner and/or diffusion barrier material in the trenches and in the single-level via hole 71. In that case the conductive line material may be deposited on the conductive material 74 with the liner/diffusion barrier material forming an intermediate layer there between. Subsequent to the filling of the dielectric layer trenches 73 the semiconductor structure may be subjected to a chemical-mechanical planarization (CMP) wherein the planarized structure shown in FIG. 1L may be obtained.

In the above the methods of the embodiments have mainly been described with reference to a limited number of examples. However, as is readily appreciated by a person skilled in the art, other examples than the ones disclosed above are equally possible within the scope of the methods of the embodiments, as defined by the appended claims. For instance, after the forming of the third interconnection level 40, one or more further interconnection levels may be formed. A further interconnection level may be formed on the third interconnection level 40 using the above disclosed process to include conductive lines and single-level vias, as well as multi-level vias connecting to lines of the second interconnection level.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

As used in the claims below and throughout this disclosure, by the phrase "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they affect the activity or action of the listed elements.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for forming a multi-level interconnect structure on a substrate, comprising:
    forming on a substrate a first interconnection level comprising a first dielectric layer and a first set of conductive structures arranged in the first dielectric layer; thereafter
    forming on the first interconnection level a second interconnection level comprising a second dielectric layer and a second set of conductive structures arranged in the second dielectric layer; and thereafter
    forming on the second interconnection level a third interconnection level, wherein forming the third interconnection level comprises:
    forming a third dielectric layer,
    forming a trench mask on the third dielectric layer, the trench mask comprising a pattern of trenches for defining positions of a third set of conductive structures to be formed in the third dielectric layer,
    forming a multi-level via hole by etching the third dielectric layer in a region exposed within one of the trenches, the multi-level via hole extending through the third dielectric layer and the second dielectric layer to a structure of the first set of conductive structures such that a surface of the structure is exposed at a bottom of the multi-level via hole,
    selectively depositing a first conductive material in the multi-level via hole on the structure of the first set of conductive structures,
    transferring the pattern of the trench mask into the third dielectric layer by etching to form a set of dielectric layer trenches for accommodating the third set of conductive structures, and
    depositing a second conductive material filling the set of dielectric layer trenches, wherein the second conductive material deposited in one of the dielectric layer trenches is deposited on the first conductive material selectively deposited in the multi-level via hole.

2. The method of claim 1, wherein the dielectric layer trenches are formed with a depth in the third dielectric layer such that an upper surface of the first conductive material deposited in the multi-level via hole is exposed in the one trench of the set of trenches in the third dielectric layer.

3. The method of claim 1, further comprising forming a dielectric liner covering a sidewall of the multi-level via hole and exposing the surface of the structure of the first set of conductive structures.

4. The method of claim 3, wherein the dielectric liner is formed to further cover sidewalls of the trenches of the trench mask.

5. The method of claim 1, wherein the first conductive material is selectively deposited in the multi-level via hole by an electro-less deposition process or an atomic layer deposition process.

6. The method of claim 1, wherein the trench mask comprises a hard mask material.

7. A method for forming a multi-level interconnect structure on a substrate, comprising:
- forming on a substrate a first interconnection level comprising a first dielectric layer and a first set of conductive structures arranged in the first dielectric layer;
- forming on the first interconnection level a second interconnection level comprising a second dielectric layer and a second set of conductive structures arranged in the second dielectric layer; and
- forming on the second interconnection level a third interconnection level, wherein forming the third interconnection level comprises:
  - forming a third dielectric layer,
  - forming a trench mask on the third dielectric layer, the trench mask comprising a pattern of trenches for defining positions of a third set of conductive structures to be formed in the third dielectric layer,
  - forming a multi-level via hole by etching the third dielectric layer in a region exposed within one of the trenches, the multi-level via hole extending through the third dielectric layer and the second dielectric layer to a structure of the first set of conductive structures such that a surface of the structure is exposed at a bottom of the multi-level via hole,
  - selectively depositing a first conductive material in the multi-level via hole on the structure of the first set of conductive structures, wherein the first conductive material is selectively deposited to only partially fill the multi-level via hole,
  - transferring the pattern of the trench mask into the third dielectric layer by etching to form a set of dielectric layer trenches for accommodating the third set of conductive structures, and
  - depositing a second conductive material filling the set of dielectric layer trenches, wherein the second conductive material deposited in one of the dielectric layer trenches is deposited on the first conductive material selectively deposited in the multi-level via hole.

8. A method for forming a multi-level interconnect structure on a substrate, comprising:
- forming on a substrate a first interconnection level comprising a first dielectric layer and a first set of conductive structures arranged in the first dielectric layer;
- forming on the first interconnection level a second interconnection level comprising a second dielectric layer and a second set of conductive structures arranged in the second dielectric layer; and
- forming on the second interconnection level a third interconnection level, wherein forming the third interconnection level comprises:
  - forming a third dielectric layer,
  - forming a trench mask on the third dielectric layer, the trench mask comprising a pattern of trenches for defining positions of a third set of conductive structures to be formed in the third dielectric layer,
  - forming a via mask above the trench mask, the via mask including an opening exposing a region of the third dielectric layer,
  - forming a multi-level via hole by etching the third dielectric layer in the region exposed within one of the trenches, the multi-level via hole extending through the third dielectric layer and the second dielectric layer to a structure of the first set of conductive structures such that a surface of the structure is exposed at a bottom of the multi-level via hole, wherein the multi-level via hole is formed by transferring the opening into the third and second dielectric layers by etching,
  - selectively depositing a first conductive material in the multi-level via hole on the structure of the first set of conductive structures,
  - transferring the pattern of the trench mask into the third dielectric layer by etching to form a set of dielectric layer trenches for accommodating the third set of conductive structures, and
  - depositing a second conductive material filling the set of dielectric layer trenches, wherein the second conductive material deposited in one of the dielectric layer trenches is deposited on the first conductive material selectively deposited in the multi-level via hole.

9. A method for forming a multi-level interconnect structure on a substrate, comprising:
- forming on a substrate a first interconnection level comprising a first dielectric layer and a first set of conductive structures arranged in the first dielectric layer;
- forming on the first interconnection level a second interconnection level comprising a second dielectric layer and a second set of conductive structures arranged in the second dielectric layer; and
- forming on the second interconnection level a third interconnection level, wherein forming the third interconnection level comprises:
  - forming a third dielectric layer,
  - forming a trench mask on the third dielectric layer, the trench mask comprising a pattern of trenches for defining positions of a third set of conductive structures to be formed in the third dielectric layer,
  - forming a multi-level via hole by etching the third dielectric layer in a region exposed within one of the trenches, the multi-level via hole extending through the third dielectric layer and the second dielectric layer to a structure of the first set of conductive structures such that a surface of the structure is exposed at a bottom of the multi-level via hole,
  - depositing, in the multi-level via hole, a seed layer on the surface of the structure of the first set of conductive structures,
  - selectively depositing the first conductive material on the seed layer in the multi-level via hole on the structure of the first set of conductive structures,
  - transferring the pattern of the trench mask into the third dielectric layer by etching to form a set of dielectric layer trenches for accommodating the third set of conductive structures, and
  - depositing a second conductive material filling the set of dielectric layer trenches, wherein the second conductive material deposited in one of the dielectric layer trenches is deposited on the first conductive material selectively deposited in the multi-level via hole.

10. A method for forming a multi-level interconnect structure on a substrate, comprising:
- forming on a substrate a first interconnection level comprising a first dielectric layer and a first set of conductive structures arranged in the first dielectric layer;
- forming on the first interconnection level a second interconnection level comprising a second dielectric layer and a second set of conductive structures arranged in the second dielectric layer; and forming on the second interconnection level a third interconnection level, wherein forming the third interconnection level comprises:
  forming a third dielectric layer,
  forming a trench mask on the third dielectric layer, the trench mask comprising a pattern of trenches for defining positions of a third set of conductive structures to be formed in the third dielectric layer,
  forming a multi-level via hole by etching the third dielectric layer in a region exposed within one of the trenches, the multi-level via hole extending through the third dielectric layer and the second dielectric layer to a structure of the first set of conductive structures such that a surface of the structure is exposed at a bottom of the multi-level via hole,
  selectively depositing a first conductive material in the multi-level via hole on the structure of the first set of conductive structures,
  transferring the pattern of the trench mask into the third dielectric layer by etching to form a set of dielectric layer trenches for accommodating the third set of conductive structures,
  removing the trench mask, and thereafter
  depositing a second conductive material filling the set of dielectric layer trenches, wherein the second conductive material deposited in one of the dielectric layer trenches is deposited on the first conductive material selectively deposited in the multi-level via hole.

11. A method for forming a multi-level interconnect structure on a substrate, comprising:
  forming on a substrate a first interconnection level comprising a first dielectric layer and a first set of conductive structures arranged in the first dielectric layer;
  forming on the first interconnection level a second interconnection level comprising a second dielectric layer and a second set of conductive structures arranged in the second dielectric layer; and
  forming on the second interconnection level a third interconnection level, wherein forming the third interconnection level comprises:
  forming a third dielectric layer,
  forming a trench mask on the third dielectric layer, the trench mask comprising a pattern of trenches for defining positions of a third set of conductive structures to be formed in the third dielectric layer,
  forming a multi-level via hole by etching the third dielectric layer in a region exposed within one of the trenches, the multi-level via hole extending through the third dielectric layer and the second dielectric layer to a structure of the first set of conductive structures such that a surface of the structure is exposed at a bottom of the multi-level via hole,
  selectively depositing a first conductive material in the multi-level via hole on the structure of the first set of conductive structures, and thereafter forming a single-level via hole by etching the third dielectric layer in a region exposed within one of the trenches, the single-level via hole extending partially through the third dielectric layer, wherein during the act of transferring the pattern of the trench mask into the third dielectric layer, a bottom surface of the single-level via hole is etched back such that the single-level via hole extends to and exposes a surface of a structure of the second set of conductive structures,
  transferring the pattern of the trench mask into the third dielectric layer by etching to form a set of dielectric layer trenches for accommodating the third set of conductive structures,
  depositing a second conductive material filling the set of dielectric layer trenches, wherein the second conductive material deposited in one of the dielectric layer trenches is deposited on the first conductive material selectively deposited in the multi-level via hole.

* * * * *